United States Patent
Hayashi et al.

(10) Patent No.: US 10,173,922 B2
(45) Date of Patent: Jan. 8, 2019

(54) GLASS

(71) Applicant: Nippon Electric Glass Co., Ltd., Shiga (JP)

(72) Inventors: Masahiro Hayashi, Shiga (JP); Shinkichi Miwa, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 14/901,248

(22) PCT Filed: Jul. 4, 2014

(86) PCT No.: PCT/JP2014/067889
§ 371 (c)(1),
(2) Date: Dec. 28, 2015

(87) PCT Pub. No.: WO2015/005235
PCT Pub. Date: Jan. 15, 2015

(65) Prior Publication Data
US 2016/0368815 A1 Dec. 22, 2016

(30) Foreign Application Priority Data
Jul. 11, 2013 (JP) ................................. 2013-145271

(51) Int. Cl.
*C03C 3/087* (2006.01)
*C03C 3/091* (2006.01)
*C03C 10/04* (2006.01)
*C03C 10/00* (2006.01)
*C03C 3/093* (2006.01)
*H01L 27/12* (2006.01)
*G02F 1/1368* (2006.01)
*G02F 1/1333* (2006.01)
*H01L 51/00* (2006.01)

(52) U.S. Cl.
CPC .......... *C03C 10/0045* (2013.01); *C03C 3/093* (2013.01); *C03C 10/0009* (2013.01); *C03C 10/0036* (2013.01); *C03C 10/0054* (2013.01); *H01L 27/1218* (2013.01); *H01L 27/1225* (2013.01); *C03C 2204/00* (2013.01); *G02F 1/1368* (2013.01); *G02F 2001/133302* (2013.01); *H01L 51/0096* (2013.01)

(58) Field of Classification Search
CPC .................................. C03C 3/091; C03C 3/093
See application file for complete search history.

(56) References Cited

U.S. PATENT DOCUMENTS

| | | | | |
|---|---|---|---|---|
| 5,851,939 A * | 12/1998 | Miwa | ...................... | C03C 3/091 501/66 |
| 6,169,047 B1 * | 1/2001 | Nishizawa | .............. | C03C 3/091 428/428 |
| 6,329,310 B1 * | 12/2001 | Peuchert | .................. | C03C 3/091 501/64 |
| 6,671,026 B2 * | 12/2003 | Peuchert | .................. | C03C 3/091 349/158 |
| 6,852,658 B2 * | 2/2005 | Peuchert | .................. | C03C 3/093 501/65 |
| 6,858,552 B2 * | 2/2005 | Peuchert | .................. | C03C 3/093 501/65 |
| 8,785,336 B2 * | 7/2014 | Kawaguchi | ............. | C03C 3/093 501/66 |
| 8,993,465 B2 * | 3/2015 | Ellison | .................... | C03C 3/087 501/69 |
| 9,023,744 B2 * | 5/2015 | Kawaguchi | ............. | C03C 3/091 501/66 |
| 9,051,206 B2 * | 6/2015 | Allan et al. | | |
| 9,162,919 B2 * | 10/2015 | Ellison | .................... | C03C 3/093 |
| 9,604,870 B2 * | 3/2017 | Ellison | .................... | C03C 3/091 |
| 2009/0275462 A1 * | 11/2009 | Murata | ................... | C03C 3/091 501/66 |
| 2012/0088648 A1 | 4/2012 | Ellison et al. | | |
| 2013/0225390 A1 * | 8/2013 | Ellison | .................... | C03C 3/093 501/66 |
| 2013/0288876 A1 | 10/2013 | Fujisawa et al. | | |
| 2013/0296157 A1 * | 11/2013 | Ellison | .................... | C03C 3/087 501/59 |
| 2014/0179510 A1 * | 6/2014 | Allan et al. | | |
| 2014/0249017 A1 * | 9/2014 | Allan et al. | | |
| 2015/0315065 A1 * | 11/2015 | Miwa | ..................... | C03C 3/093 501/67 |

FOREIGN PATENT DOCUMENTS

| | | | |
|---|---|---|---|
| CN | 103068763 | | 4/2013 |
| JP | 2002-3240 | | 1/2002 |
| JP | 2011126728 | * | 6/2011 |
| JP | 2012-82130 | | 4/2012 |
| JP | 2012-184146 | | 9/2012 |
| JP | 2014-118313 | | 6/2014 |
| WO | 9711920 | * | 4/1997 |
| WO | 2012103194 | * | 5/2012 |

OTHER PUBLICATIONS

International Search Report dated Oct. 7, 2014 in International (PCT) Application No. PCT/JP2014/067889.
International Preliminary Report on Patentability dated Jan. 12, 2016 in corresponding International Application No. PCT/JP2014/067889.
Search Report dated Dec. 19, 2016 in corresponding Chinese Application No. 201480022055.0, with partial English translation.

* cited by examiner

*Primary Examiner* — Karl E Group
(74) *Attorney, Agent, or Firm* — Wenderoth, Lind & Ponack, L.L.P.

(57) ABSTRACT

A glass composition $SiO_2$, $Al_2O_3$, $B_2O_3$, and RO, where RO represents one kind or two or more kinds selected from MgO, CaO, SrO, and BaO, and allows two or more kinds of crystals selected from a $SiO_2$—$Al_2O_3$—RO-based crystal, a $SiO_2$-based crystal, and a $SiO_2$—$Al_2O_3$-based crystal to precipitate in a temperature range of from a liquidus line temperature to (the liquidus line temperature—50° C.)

13 Claims, No Drawings

GLASS

TECHNICAL FIELD

The present invention relates to a glass, and more specifically, to a glass suitable for an OLED display or a liquid crystal display. More particularly, the present invention relates to a glass suitable for a display driven by an oxide TFT or a low-temperature p-Si.TFT (LTPS).

BACKGROUND ART

A glass has hitherto been widely used as a substrate for a flat panel display, such as a liquid crystal display, a hard disk, a filter, a sensor, or the like. In recent years, in addition to a conventional liquid crystal display, an OLED display has been actively developed by virtue of its self luminescence, high color reproducibility, wide viewing angle, high-speed response, high definition, and the like. Some of the developed OLED displays have already been put to practical use. Meanwhile, a liquid crystal display or an OLED display for a mobile device, such as a smartphone, requires a screen with ultra-high definition, because such display has a small area but needs to display a lot of information. Besides, such display requires high-speed response as well, because a moving image is displayed thereon.

In such application, an OLED display or a liquid crystal display driven by a LTPS is suitable. The OLED display emits light when an electric current flows through an OLED element serving as a constituent of a pixel. Therefore, a material exhibiting low resistance and a high electron mobility is used as a drive TFT element. As such material, an oxide TFT formed typically of indium gallium zinc oxide (IGZO) has attracted attention, aside from the above-mentioned LTPS. The oxide TFT has low resistance, a high mobility, and can be formed at relatively low temperature. The conventional p-Si.TFT, in particular, the LTPS, is liable to have variations in TFT characteristics upon its formation on a large-size glass sheet, owing to instability of an excimer laser to be used in polycrystallization of an amorphous Si (a-Si) film. Therefore, in a TV application or the like, display unevenness is liable to occur in a screen. In contrast, the oxide TFT is excellent in homogeneity of TFT characteristics upon its formation on a large-size glass sheet. Therefore, the oxide TFT has attracted attention as a potential TFT formation material, and some of the oxide TFTs have already been put to practical use.

SUMMARY OF INVENTION

Technical Problem

A glass to be used for a substrate of a high-definition display is required to have various characteristics. In particular, the glass is required to have the following characteristics (1) to (5).

(1) To contain an alkaline component (in particular, a Li component or a Na component) at a low content or be substantially free of the alkaline component, because an alkali ion is diffused during heat treatment into a semiconductor substance having been formed into a film and causes degradation in the characteristics of the film when glass contains the alkaline component at a high content.

(2) To have excellent chemical resistance, because various chemicals, such as an acid or an alkali, are used in a photolithography and etching step.

(3) To undergo less thermal shrinkage, in particular, have a high strain point, because the glass sheet is subjected to heat treatment at a temperature of several hundred degrees C. in steps of film formation, annealing, and the like, and hence a pattern shift or the like is liable to occur when the glass sheet undergoes thermal shrinkage during the heat treatment.

(4) To have a thermal expansion coefficient close to that of a film member to be formed on the glass sheet (for example, of a-Si or p-Si), for example, have a thermal expansion coefficient of from 30 to $40 \times 10^{-7}/°$ C. It should be noted that a thermal expansion coefficient of $40 \times 10^{-7}/°$ C. or less improves thermal shock resistance as well.

(5) To have a high Young's modulus (or a high specific Young's modulus) in order to suppress failures attributed to the deflection of the glass sheet.

Further, the glass is required to have the following characteristics (6) and (7) from the viewpoint of manufacturing a glass sheet.

(6) To have excellent meltability in order to prevent melt defects, such as bubbles, stones, and cords.

(7) To have excellent devitrification resistance in order to avoid the generation of foreign matter in the glass sheet.

A promising glass system satisfying the above-mentioned demand characteristics (1) to (7) is a glass comprising $SiO_2$, $Al_2O_3$, $B_2O_3$, and RO (RO represents one kind or two or more kinds selected from MgO, CaO, SrO, and BaO). However, such glass has a problem in that a forming temperature is liable to be increased in its forming using an overflow down-draw method or the like, and hence devitrified foreign matter is liable to be generated in the glass during its forming. In particular, in order to increase the strain point and Young's modulus of the glass, it is highly necessary to increase the contents of $Al_2O_3$ and MgO and reduce the content of $B_2O_3$, but in this case, the above-mentioned problem is liable to appear.

The present invention has been made in view of such circumstance, and a technical object of the present invention is to devise a glass suitable for an OLED display or a liquid crystal display driven by a LTPS element or an oxide TFT element, and specifically, to devise a glass having high devitrification resistance even when having a high strain point and a high Young's modulus.

Solution to Problem

The inventors of the present invention have repeated various experiments. As a result, the inventors have focused attention on a $SiO_2$—$Al_2O_3$—$B_2O_3$—RO-based glass (RO represents one kind or two or more kinds selected from MgO, CaO, SrO, and BaO), and found that optimization of the contents of $SiO_2$, $Al_2O_3$, $B_2O_3$, and RO leads to improvements in strain point, Young's modulus, and the like. Besides, it has been found that, through such optimization, the glass is stabilized and remarkably improved in devitrification resistance when two or more kinds of crystals selected from a $SiO_2$—$Al_2O_3$—RO-based crystal, a $SiO_2$-based crystal, and a $SiO_2$—$Al_2O_3$-based crystal precipitate as initial phases. That is, a glass according to one embodiment of the present invention comprises as a glass composition $SiO_2$, $Al_2O_3$, $B_2O_3$, and RO and allows two or more kinds of crystals selected from a $SiO_2$—$Al_2O_3$—RO-based crystal, a $SiO_2$-based crystal, and a $SiO_2$—$Al_2O_3$-based crystal to precipitate in a temperature range of from a liquidus line temperature to (the liquidus line temperature—50° C.). The "liquidus line temperature" refers to the highest temperature at which devitrification (crystalline foreign matter) is observed in glass by microscopy when glass powder that has passed through a standard 30-mesh sieve (500 μm) and remained on a 50-mesh sieve (300 μm) is placed in a platinum boat and kept for 24 hours in a gradient heating furnace, followed by taking the platinum boat out of the gradient heating furnace. The "-based crystal" refers to a crystal formed of the explicit component.

In the glass according to the embodiment of the present invention, it is preferred that the $SiO_2$—$Al_2O_3$—RO-based crystal comprise a $SiO_2$—$Al_2O_3$—CaO-based crystal.

In the glass according to the embodiment of the present invention, it is preferred that the $SiO_2$—$Al_2O_3$—RO-based crystal comprise anorthite, the $SiO_2$-based crystal comprise cristobalite, and the $SiO_2$—$Al_2O_3$-based crystal comprise mullite.

In the glass according to the embodiment of the present invention, it is preferred that the liquidus line temperature be lower than 1,250° C.

In the glass according to the embodiment of the present invention, it is preferred that a content of $Li_2O+Na_2O+K_2O$ in the glass composition be 0.5 mass % or less. With this, a situation in which an alkali ion is diffused during heat treatment into a semiconductor substance having been formed into a film and causes degradation in the characteristics of the film is easily prevented. Herein, the "content of $Li_2O+Na_2O+K_2O$" refers to the total content of $Li_2O$, $Na_2O$, and $K_2O$.

It is preferred that the glass according to the embodiment of the present invention comprise as a glass composition, in terms of mass %, 57% to 70% of $SiO_2$, 16% to 25% of $Al_2O_3$, 1% to 8% of $B_2O_3$, 0% to 5% of MgO, 2% to 13% of CaO, 0% to 6% of SrO, 0% to 7% of BaO, 0% to 5% of ZnO, 0% to 5% of $ZrO_2$, 0% to 5% of $TiO_2$, and 0% to 5% of $P_2O_5$, and have a molar ratio (MgO+CaO+SrO+BaO)/$Al_2O_3$ of from 0.8 to 1.3 and a molar ratio CaO/$Al_2O_3$ of from 0.3 to 1.0. Herein, the "content of MgO+CaO+SrO+BaO" refers to the total content of MgO, CaO, SrO, and BaO.

It is preferred that the glass according to the embodiment of the present invention comprise as a glass composition, in terms of mass %, 58% to 70% of $SiO_2$, 16% to 25% of $Al_2O_3$, 2% to 7% of $B_2O_3$, 0% to 5% of MgO, 3% to 13% of CaO, 0% to 6% of SrO, 0% to 6% of BaO, 0% to 5% of ZnO, 0% to 5% of $ZrO_2$, 0% to 5% of $TiO_2$, 0% to 5% of $P_2O_5$, and 0% to 5% of $SnO_2$, have a molar ratio (MgO+CaO+SrO+BaO)/$Al_2O_3$ of from 0.8 to 1.3 and a molar ratio CaO/$Al_2O_3$ of from 0.3 to 1.0, and be substantially free of $Li_2O$ and $Na_2O$. Herein, the "substantially free of" refers to the case where the content of the explicit component is 0.1% or less (preferably 0.05% or less). For example, the "substantially free of a $Li_2O$ component" refers to the case where the content of a $Li_2O$ component is 0.1% or less (preferably 0.05% or less).

It is preferred that the glass according to the embodiment of the present invention have a molar ratio CaO/MgO of from 2 to 20.

It is preferred that the glass according to the embodiment of the present invention have a strain point of 700° C. or more. Herein, the "strain point" refers to a value measured by a method in accordance with ASTM C336.

It is preferred that the glass according to the embodiment of the present invention have a Young's modulus of 75 GPa or more. The "Young's modulus" refers to a value measured by a dynamic elastic modulus measurement method (resonance method) in accordance with JIS R1602.

It is preferred that the glass according to the embodiment of the present invention have a specific Young's modulus of 30 GPa/(g/cm$^3$) or more. Herein, the "specific Young's modulus" refers to a value obtained by dividing a Young's modulus by a density.

It is preferred that the glass according to the embodiment of the present invention have a flat sheet shape and be used for a liquid crystal display.

It is preferred that the glass according to the embodiment of the present invention have a flat sheet shape and be used for an OLED display.

It is preferred that the glass according to the embodiment of the present invention have a flat sheet shape and be used for a display driven by an oxide TFT.

DESCRIPTION OF EMBODIMENTS

A glass of the present invention has a property of allowing two or more kinds of crystals selected from a $SiO_2$—$Al_2O_3$—RO-based crystal, a $SiO_2$-based crystal, and a $SiO_2$—$Al_2O_3$-based crystal to precipitate in a temperature range of from a liquidus line temperature to (the liquidus line temperature—50° C.). The glass of the present invention preferably has a property of allowing the three kinds of crystals to precipitate in the temperature range. In addition, in the case of allowing two kinds of crystals to precipitate, a $SiO_2$—$Al_2O_3$—RO-based crystal and a $SiO_2$-based crystal are preferably allowed to precipitate. In the vicinity of a region in which a plurality of crystal phases are in equilibrium with a liquid, the glass is stabilized and its liquidus line temperature is considerably reduced. Further, when the glass allows a plurality of the above-mentioned crystals to precipitate near the liquidus line temperature, such glass easily satisfies the above-mentioned demand characteristics (1) to (7).

As the $SiO_2$—$Al_2O_3$—RO-based crystal, a $SiO_2$—$Al_2O_3$—CaO-based crystal is preferred, and anorthite is particularly preferred. As the $SiO_2$-based crystal, cristobalite is preferred. As the $SiO_2$—$Al_2O_3$-based crystal, mullite is preferred. When the glass allows a plurality of the above-mentioned crystals to precipitate near the liquidus line temperature, such glass more easily satisfies the above-mentioned demand characteristics (1) to (7), in particular, the demand characteristic (7).

It is preferred that the glass of the present invention comprise as a glass composition, in terms of mass %, 57% to 70% of $SiO_2$, 16% to 25% of $Al_2O_3$, 1% to 8% of $B_2O_3$, 0% to 5% of MgO, 2% to 13% of CaO, 0% to 6% of SrO, 0% to 7% of BaO, 0% to 5% of ZnO, 0% to 5% of $ZrO_2$, 0% to 5% of $TiO_2$, and 0% to 5% of $P_2O_5$, and have a molar ratio (MgO+CaO+SrO+BaO)/$Al_2O_3$ of from 0.8 to 1.3 and a molar ratio CaO/$Al_2O_3$ of from 0.3 to 1.0. The reasons why the contents of the components are restricted as described above are hereinafter described. It should be noted that the expression "%" refers to "mass %" in the descriptions of the components, unless otherwise stated.

When the content of $SiO_2$ is too low, chemical resistance, in particular, acid resistance lowers, a strain point lowers, and it becomes difficult to achieve a low density. In contrast, when the content of $SiO_2$ is too high, a viscosity at high temperature becomes higher, and meltability is liable to lower. In addition, the $SiO_2$-based crystal, in particular, cristobalite precipitates, and the liquidus line viscosity is liable to lower. The upper limit content of $SiO_2$ is preferably 70%, 68%, 66%, or 65%, particularly preferably 64%, and the lower limit content is preferably 57%, 58%, 59%, or 60%, particularly preferably 61%. The content most preferably falls within a range of from 61% to 64%.

When the content of $Al_2O_3$ is too low, the strain point lowers, a thermal shrinkage value becomes higher, a Young's modulus lowers, and a glass sheet is liable to be deflected. In contrast, when the content of $Al_2O_3$ is too high, buffered hydrofluoric acid (BHF) resistance lowers and white turbidity is liable to occur in the surface of the glass. In addition, crack resistance is liable to lower. Further, the $SiO_2$—$Al_2O_3$-based crystal, in particular, mullite precipitates and the liquidus line viscosity is liable to lower. The upper limit content of $Al_2O_3$ is preferably 25%, 23%, 22%, or 21%, particularly preferably 20%, and the lower limit content is preferably 16%, 17%, or 17.5%, particularly preferably 18%. The content most preferably falls within a range of from 18% to 20%.

$B_2O_3$ is a component that acts as a melting accelerate component, and lowers the viscosity and improves the meltability. The content of $B_2O_3$ is preferably from 1% to 8%, from 2% to 8%, from 3% to 7.5%, from 3% to 7%, or from 4% to 7%, particularly preferably from 5% to 7%. When the content of $B_2O_3$ is too low, $B_2O_3$ does not act sufficiently as a melting accelerate component, and the BHF resistance and the crack resistance are liable to lower. In addition, the liquidus line temperature is liable to increase. In contrast, when the content of $B_2O_3$ is too high, the strain point, heat resistance, and the acid resistance are liable to lower. In particular, when the content of $B_2O_3$ is 7% or more, such tendencies are remarkable. In addition, when the content of $B_2O_3$ is too high, the Young's modulus lowers, and the deflection amount of the glass sheet is liable to increase.

In consideration of the balance between the strain point and the meltability, the mass ratio $Al_2O_3/B_2O_3$ is preferably from 1 to 5, from 1.5 to 4.5, or from 2 to 4, particularly preferably from 2.5 to 3.5.

MgO is a component that improves the meltability by lowering the viscosity at high temperature without lowering the strain point. In addition, MgO is most effective in reducing the density among ROs. However, when MgO is introduced in an excessive amount, the $SiO_2$-based crystal, in particular, cristobalite precipitates, and the liquidus line viscosity is liable to lower. Further, MgO is a component that is susceptible to a reaction with BHF or hydrofluoric acid to form a product. The reaction product may cause white turbidity in an element on the surface of the glass sheet or in the glass sheet through fixation onto the element or adhesion onto the glass sheet. Therefore, the content of MgO is preferably from 0% to 5%, more preferably from 0.01% to 4%, still more preferably from 0.03% to 3%, most preferably from 0.05% to 2.5%.

As with MgO, CaO is a component that remarkably improves the meltability by lowering the viscosity at high temperature without lowering the strain point. When the content of CaO is too high, the $SiO_2$—$Al_2O_3$—RO-based crystal, in particular, anorthite precipitates, and the liquidus line viscosity is liable to lower. Besides, the BHF resistance lowers, and the reaction product may cause white turbidity in the element on the surface of the glass sheet or in the glass sheet through fixation onto the element or adhesion onto the glass sheet. The upper limit content of CaO is preferably 12%, 11%, or 10.5%, particularly preferably 10%, and the lower limit content is preferably 2%, 3%, or 3.5%, particularly preferably 4%. The content most preferably falls within a range of from 4% to 10%.

When the molar ratio $CaO/Al_2O_3$ is adjusted within a predetermined range, two or more kinds of crystals easily precipitate at a temperature near the liquidus line temperature. When the molar ratio $CaO/Al_2O_3$ is small, the $SiO_2$—$Al_2O_3$-based crystal easily precipitates. In contrast, when the molar ratio $CaO/Al_2O_3$ is large, the $SiO_2$—$Al_2O_3$—CaO-based crystal easily precipitates. An upper limit value of the molar ratio $CaO/Al_2O_3$ is preferably 1.0, 0.9, 0.85, 0.8, 0.78, or 0.76, particularly preferably 0.75. A lower limit value of the molar ratio $CaO/Al_2O_3$ is preferably 0.3, 0.4, 0.5, 0.55, 0.58, 0.60, 0.62, or 0.64, particularly preferably 0.65.

When the molar ratio CaO/MgO is adjusted within a predetermined range, two or more kinds of crystals easily precipitate at a temperature near the liquidus line temperature. When the molar ratio CaO/MgO is small, the $SiO_2$-based crystal easily precipitates. In contrast, when the molar ratio CaO/MgO is large, the $SiO_2$—$Al_2O_3$—CaO-based crystal easily precipitates. An upper limit value of the molar ratio CaO/MgO is preferably 20, 17, 14, 12, 10, or 8, particularly preferably 6. A lower limit value of the molar ratio CaO/MgO is preferably 2, 2.5, 2.8, 3.1, 3.3, 3.5, or 3.8, particularly preferably 4.

SrO is a component that enhances the chemical resistance and the devitrification resistance. However, when its ratio in the total content of ROs is excessively high, the meltability is liable to lower, and the density and a thermal expansion coefficient are liable to increase. Therefore, the content of SrO is preferably from 0% to 6% or from 0% to 5%, particularly preferably from 0% to 4.5%.

BaO is a component that enhances the chemical resistance and the devitrification resistance. However, when its content is too high, the density is liable to increase. In addition, BaO is less effective in enhancing the meltability among ROs. A glass comprising $SiO_2$, $Al_2O_3$, $B_2O_3$, and RO in its glass composition is generally hard to melt, and hence it is significantly important to enhance the meltability and reduce a defective rate attributed to bubbles, foreign matter, or the like from the view point of supplying a high-quality glass sheet at low cost in a large amount. Therefore, the content of BaO is preferably from 0% to 7%, from 0% to 6%, or from 0.1% to 5%, particularly preferably from 0.5% to 4%. It should be noted that, in the glass comprising $SiO_2$, $Al_2O_3$, $B_2O_3$, and RO in its glass composition, a lower content of $SiO_2$ effectively enhances the meltability, but the lower content of $SiO_2$ is liable to lower the acid resistance, and concurrently increase the density and the thermal expansion coefficient.

MgO, SrO, and BaO each have property of enhancing the crack resistance, as compared to CaO. Therefore, the content of MgO+SrO+BaO (the total content of MgO, SrO, and BaO) is preferably 2% or more or 3% or more, particularly preferably more than 3%. However, when the content of MgO+SrO+BaO is too high, the density and the thermal expansion coefficient are liable to increase. Therefore, the content of MgO+SrO+BaO is preferably 9% or less, or 8% or less.

When two or more kinds selected from ROs are mixed and introduced, the liquidus line temperature significantly lowers and crystalline foreign matter is hardly generated in the glass, and the meltability and formability are improved. However, when the content of MgO+CaO+SrO+BaO is too high, the density increases, and it becomes difficult to achieve a reduction in weight of the glass sheet. Therefore, the content of MgO+CaO+SrO+BaO is preferably less than 15%, or less than 14%, particularly preferably less than 13%.

When the molar ratio (MgO+CaO+SrO+BaO)/$Al_2O_3$ is adjusted within a predetermined range, two or more kinds of crystals easily precipitate at a temperature near the liquidus line temperature. When the molar ratio (MgO+CaO+SrO+BaO)/$Al_2O_3$ is small, the $SiO_2$—$Al_2O_3$-based crystal easily precipitates. In contrast, when the molar ratio (MgO+CaO+

SrO+BaO)/Al$_2$O$_3$ is large, the SiO$_2$—Al$_2$O$_3$—RO-based crystal and the SiO$_2$-based crystal easily precipitate. An upper limit value of the molar ratio (MgO+CaO+SrO+BaO)/Al$_2$O$_3$ is preferably 1.3, 1.25, 1.2, 1.15, or 1.10, particularly preferably 1.08. A lower limit value of the molar ratio (MgO+CaO+SrO+BaO)/Al$_2$O$_3$ is preferably 0.8, 0.85, 0.88, 0.91, 0.93, 0.95, or 0.96, particularly preferably 0.97.

In view of the optimization of the mixing ratio of RO, the mass ratio CaO/(MgO+SrO+BaO) is preferably 0.7 or more, 0.8 or more, or 0.9 or more, particularly preferably 1 or more, and the mass ratio CaO/MgO is preferably 2 or more, 3 or more, or 4 or more, particularly preferably 5 or more.

ZnO is a component that improves the meltability and the BHF resistance. However, when its content is too high, it is difficult to secure the heat resistance, because the glass is liable to be devitrified or the s train point lowers. Therefore, the content of ZnO is preferably from 0% to 5%, particularly preferably from 0% to 1%.

ZrO$_2$ is a component that enhances chemical durability. However, when its introduction amount is too large, devitrification stones of ZrSiO$_4$ are liable to be generated. The lower limit content of ZrO$_2$ is preferably 1%, 0.5%, 0.3%, or 0.2%, particularly preferably 0.1%. It is preferred to introduce ZrO$_2$ at a content of 0.005% or more from the viewpoint of the chemical durability. The content most preferably falls within a range of from 0.005% to 0.1%. It should be noted that ZrO$_2$ may be introduced from a raw material or through elution from a refractory.

TiO$_2$ has an effect of enhancing the meltability by lowering the viscosity at high temperature, and an effect of enhancing the chemical durability as well. However, when its introduction amount becomes excessive, an ultraviolet light transmittance is liable to lower. The content of TiO$_2$ is preferably 3% or less, 1% or less, 0.5% or less, 0.1% or less, or 0.05% or less, particularly preferably 0.03% or less. It should be noted that, when TiO$_2$ is introduced in an extremely small amount (for example, 0.001% or more), an effect of suppressing coloration caused by ultraviolet light is obtained.

P$_2$O$_5$ is a component which increases the strain point, and is also a component which effectively suppresses the precipitation of the SiO$_2$—Al$_2$O$_3$—RO-based crystal, in particular, anorthite, to allow the precipitation of two or more kinds of crystals. It should be noted that, when P$_2$O$_5$ is contained in a large amount, the glass is liable to undergo phase separation. The content of P$_2$O$_5$ is preferably from 0% to 5%, from 0% to 3%, from 0% to 2%, or from 0% to 1%, particularly preferably from 0% to 0.5%.

As a fining agent, there may be used As$_2$O$_3$, Sb$_2$O$_3$, SnO$_2$, SO$_3$, Fe$_2$O$_3$, CeO$_2$, F$_2$, Cl$_2$, C, metal powder, such as Al powder or Si powder, or the like. The total content of those fining agents is preferably 3% or less.

As$_2$O$_3$ and Sb$_2$O$_3$ are chemical substances of concern. Therefore, it is desired to use those substances in as small amounts as possible. Each of the contents of As$_2$O$_3$ and Sb$_2$O$_3$ is preferably less than 0.3%, less than 0.1%, less than 0.09%, less than 0.05%, less than 0.03%, less than 0.01%, or less than 0.005%, particularly preferably less than 0.003%.

SnO$_2$ has a reduction action on bubbles in the glass as a fining agent, and has an effect of maintaining the ultraviolet light transmittance to a relatively high level when coexisting with Fe$_2$O$_3$ or FeO. However, when the content of SnO$_2$ is too high, devitrification stones of SnO$_2$ are liable to be generated in the glass. The upper limit content of SnO$_2$ is preferably 0.5% or 0.4%, particularly preferably 0.3%, and the lower limit content is preferably 0.01% or 0.05%, particularly preferably 0.1%. In addition, when SnO$_2$ is introduced at a content of from 0.01% to 0.5% with respect to the content of Fe$_2$O$_3$ or FeO set to from 0.01% to 0.05% in terms of Fe$_2$O$_3$, bubble quality and the ultraviolet light transmittance can be enhanced. Herein, the "in terms of Fe$_2$O$_3$" refers to a value obtained by converting the entire Fe amount to a Fe$_2$O$_3$ amount irrespective of the valence.

Iron is a component that is mixed in from the raw material as an impurity. When the content of iron is too high, the ultraviolet light transmittance may lower. When the ultraviolet light transmittance lowers, failures may occur in a photolithography step of producing a TFT or in a step of aligning a liquid crystal by using ultraviolet light. Thus, the upper limit content of iron in terms of Fe$_2$O$_3$ is preferably 0.001%, and the lower limit content in terms of Fe$_2$O$_3$ is preferably 0.05%, 0.04%, or 0.03%, particularly preferably 0.02%. The content most preferably falls within a range of from 0.001% to 0.02%.

Cr$_2$O$_3$ is a component that is mixed in from the raw material as an impurity. When the content of Cr$_2$O$_3$ is too high, failures may occur in a foreign matter test for an internal portion of a glass sheet using scattered light from incident light entering from an end surface of the glass sheet, because the light is hard to transmit during the test. Particularly in the case where the substrate has a size measuring 730 mm×920 mm or more, such failures are more liable to occur. In addition, in the case where the glass sheet has a small thickness (for example, 0.5 mm or less, 0.4 mm or less, or 0.3 mm or less), the restriction on the content of Cr$_2$O$_3$ is of great significance because the incident light entering from an end surface of the glass sheet is reduced. The upper limit content of Cr$_2$O$_3$ is preferably 0.001%, 0.0008%, 0.0006%, or 0.0005%, particularly preferably 0.0003%, and the lower limit content is preferably 0.00001%. The content most preferably falls within a range of from 0.00001% to 0.0003%.

In the case where SnO$_2$ is contained at a content of from 0.01% to 0.5%, the glass is liable to be colored when the content of Rh$_2$O$_3$ is too high. It should be noted that Rh$_2$O$_3$ may be mixed in from a production vessel made of platinum. The content of Rh$_2$O$_3$ is preferably from 0% to 0.0005%, more preferably from 0.00001% to 0.0001%.

SO$_3$ is a component which is mixed in from the raw material as an impurity. When the content of SO$_3$ is too high, bubbles called reboil are generated during melting and forming, and defects may occur in the glass. An upper limit content of SO$_3$ is preferably 0.005%, 0.003%, or 0.002%, particularly preferably 0.001%. A lower limit content of SO$_3$ is preferably 0.0001%. The content most preferably falls within a range of from 0.0001% to 0.001%.

An alkaline component, in particular, Li$_2$O or Na$_2$O degrades the characteristics of various films or semiconductor elements to be formed on the glass sheet. Therefore, it is preferred to reduce the content of the alkaline component to 0.5%. It is desired that the glass be substantially free of the alkaline component.

In addition to the above-mentioned components, another component may be introduced. The introduction amount of the other component is preferably 5% or less or 3% or less, particularly preferably 1% or less.

In recent years, there has been an increasing demand for achievement of a reduction in weight in a flat panel display for a mobile application, such as an OLED display or a liquid crystal display. Along with this, there has also been a demand for achievement of a reduction in weight in a glass sheet. In order to satisfy such demand, the glass sheet is desirably reduced in weight by achieving a low density. The density is preferably 2.52 g/cm$^3$ or less, 2.51 g/cm$^3$ or less, 2.50 g/cm³ or less, or 2.49 g/cm³ or less, particularly preferably 2.48 g/cm³ or less. In contrast, when the density is too low, the melting temperature is liable to increase, the liquidus line viscosity is liable to lower, and productivity of the glass sheet is liable to lower. In addition, the strain point is liable to lower. Therefore, the density is preferably 2.43 g/cm³ or more or 2.44 g/cm³ or more, particularly preferably 2.45 g/cm³ or more.

In the glass of the present invention, the thermal expansion coefficient is preferably from $30 \times 10^{-7}/°$ C. to $40 \times 10^{-7}/°$ C., from $32 \times 10^{-7}/°$ C. to $39 \times 10^{-7}/°$ C., or from $33 \times 10^{-7}/°$ C. to $38 \times 10^{-7}/°$ C., particularly preferably from $34 \times 10^{-7}/°$ C. to $37 \times 10^{-7}/°$ C. Such thermal expansion coefficient easily matches that of a film member to be formed on the glass sheet (for example, of a-Si or p-Si). Herein, the "thermal expansion coefficient" refers to an average thermal expansion coefficient measured in the temperature range of from 30° C. to 380° C., "and may be measured with, for example, a dilatometer.

In an OLED display, a liquid crystal display, or the like, a glass sheet having a large area (for example, 730 mm×920 mm or more, 1,100 mm×1,250 mm or more, or 1,500 mm×1,500 mm or more) and a glass sheet having a small thickness (for example, a thickness of 0.5 mm or less, 0.4 mm or less, or 0.3 mm or less) tend to be used. In such use of the glass sheet having a large area or a small thickness, there arises a significant problem of deflection due to its own weight. In order to reduce the deflection of a glass sheet, the specific Young's modulus of the glass sheet is required to be increased. The specific Young's modulus is preferably 30 GPa/g·cm⁻³ or more, 30.5 GPa/g·cm⁻³ or more, or 31 GPa/g·cm⁻³ or more, particularly preferably 31.5 GPa/g·cm⁻³ or more. In addition, in such use of the glass sheet having a large area or a small thickness, there arises a problem of warpage of the glass sheet after a heat treatment step on a surface plate or a step of forming various metal films, oxide films, semiconductor films, organic films, and the like. In order to reduce the warpage of a glass sheet, it is effective to increase the Young's modulus of the glass sheet. The Young's modulus is preferably 75 GPa or more, particularly preferably 76 GPa or more.

At present, a LTPS to be used for an ultra-high-definition mobile display offers a step at a temperature of about from 400° C. to 600° C. In order to suppress thermal shrinkage at such temperature in the step, the strain point is preferably 680° C. or more or 690° C. or more, particularly preferably 700° C. or more.

Recently, an OLED display has been used for a mobile application, a TV application, or the like. As a drive TFT element for those applications, an oxide TFT has been attracted attention, in addition to the LTPS. The oxide TFT has hitherto been produced through a process at a temperature of from 300° C. to 400° C., which is comparable to that in the case of a-Si. However, it has been revealed that, when annealing is performed at a heat treatment temperature higher than the conventionally employed temperature, more stable element characteristics can be obtained. Such heat treatment temperature is about from 400° C. to 600° C., and hence a glass sheet exhibiting less thermal shrinkage has been demanded also in this application.

In the glass of the present invention, the thermal shrinkage value, obtained by elevating the temperature from room temperature (25° C.) up to 500° C. at a rate of 5° C./min, keeping the temperature at 500° C. for 1 hour, and dropping the temperature to room temperature at a rate of 5° C./min, is preferably 30 ppm or less, 25 ppm or less, 23 ppm or less, 22 ppm or less, 21 ppm or less, 20 ppm or less, 19 ppm or less, 18 ppm or less, 17 ppm or less, or 16 ppm or less, particularly preferably 15 ppm or less. With such thermal shrinkage value, failures, such as a pixel pitch shift, do not easily occur even when thermal treatment is applied in manufacturing steps for a LTPS. It should be noted that, when the thermal shrinkage value is too small, the productivity of the glass is liable to lower. Therefore, the thermal shrinkage value is preferably 5 ppm or more, particularly preferably 8 ppm or more.

The thermal shrinkage value may be reduced by lowering a cooling speed during forming, as well as by increasing the strain point. In particular, when the annealing point of the glass is defined as Ta (° C.), and an average cooling temperature during the forming in a temperature range of from a temperature 100° C. higher than Ta to a temperature 100° C. lower than Ta is defined as R (° C./min), the cooling during the forming is performed so as to satisfy preferably the relationship $\log R \leq 0.00018361 Ta^2 - 0.23414 Ta + 75.29$, more preferably the relationship $\log R \leq 0.00011821 Ta^2 - 0.14847 Ta + 47.03$, still more preferably the relationship $\log R \leq 0.000054326 Ta^2 - 0.064985 Ta + 19.56$. When the above-mentioned relational equations are not satisfied, the thermal shrinkage value is liable to be increased excessively.

In an overflow down-draw method, molten glass flows down along the surfaces of a wedge-shaped refractory (or a refractory coated with a platinum group metal), and the molten glasses are joined at the lower end of the wedge-shaped refractory to be formed into a sheet shape. In a slot down-draw method, for example, molten glass in a ribbon shape is allowed to flow down from a pipe made of a platinum group metal having a slit-shaped opening, and then cooled to be formed into a sheet shape. When the temperature of the molten glass brought into contact with a forming device is too high, the forming device ages, and the productivity of the glass sheet is liable to lower. Therefore, the temperature at a viscosity at high temperature of $10^{5.0}$ dPa·s is preferably 1,300° C. or less, 1,280° C. or less, 1,270° C. or less, 1,260° C. or less, 1,250° C. or less, or 1,240° C. or less, particularly preferably 1,230° C. or less. Herein, the "temperature at $10^{5.0}$ dPa·s" may be measured by, for example, a platinum sphere pull up method. It should be noted that the temperature at a viscosity at high temperature of $10^{5.0}$ dPa·s corresponds to the temperature of a molten glass at the time of forming.

The glass comprising $SiO_2$, $Al_2O_3$, $B_2O_3$, and RO in its glass composition is generally hard to melt. Therefore, enhancing the meltability is an issue. When the meltability is enhanced, a defective rate attributed to bubbles, foreign matter, or the like is reduced, and hence a high-quality glass sheet can be supplied at low cost in a large amount. In contrast, when the viscosity of the glass in a high-temperature region is too high, removal of bubbles is less promoted in a melting step. Therefore, the temperature at a viscosity at high temperature of $10^{2.5}$ dPa·s is preferably 1,650° C. or less, 1,640° C. or less, 1,630° C. or less, or 1,620° C. or less, particularly preferably 1,610° C. or less. Herein, the "temperature at $10^{2.5}$ dPa·s" may be measured by, for example, a platinum sphere pull up method. It should be noted that the temperature at a viscosity at high temperature of $10^{2.5}$ dPa·s corresponds to a melting temperature. As the temperature becomes lower, the meltability becomes more excellent.

In forming by a down-draw method or the like, the devitrification resistance is important. In consideration of the forming temperature of the glass comprising $SiO_2$, $Al_2O_3$, $B_2O_3$, and RO in its glass composition, the liquidus line temperature is preferably 1,250° C. or less, 1,230° C. or less, 1,220° C. or less, 1,210° C. or less, or 1,200° C. or less, particularly preferably 1,190° C. or less. In addition, the liquidus line viscosity is preferably $10^{5.0}$ dPa·s or more, $10^{5.2}$ dPa·s or more, $10^{5.3}$ dPa·s or more, $10^{5.4}$ dPa·s or more, or $10^{5.5}$ dPa·s or more, particularly preferably $10^{5.6}$ dPa·s or more. Herein, the "liquidus line viscosity" refers to the viscosity of glass at a liquidus line temperature and may be measured by, for example, a platinum sphere pull up method.

A transparent conductive film, an insulating film, a semiconductor film, a metal film, and the like are formed on a glass sheet to be used in a high-definition display. Further, various circuits and patterns are formed through a photolithography and etching step. The glass sheet is subjected to treatment using various chemical solutions in those film formation step and photolithography and etching step. For example, in the case of a TFT-type active matrix liquid crystal display, an insulating film and a transparent conductive film are formed on a glass sheet, and a number of thin film transistors (TFTs) each formed of amorphous silicon or polycrystalline silicon are further formed on the glass sheet through a photolithography and etching step. In those steps, the glass sheet is subjected to treatment using various chemical solutions, such as sulfuric acid, hydrochloric acid, an alkaline solution, hydrofluoric acid, and BHF. In particular, BHF is widely used for etching of an insulating film, but is liable to erode the glass sheet and cause white turbidity in the surface of the glass sheet. In addition, a reaction product thereof may clog a filter during the manufacturing steps or adhere onto the glass sheet. Under the above-mentioned circumstances, it is important to enhance the chemical resistance of the glass sheet.

The glass of the present invention is preferably formed by an overflow down-draw method. The overflow down-draw method refers to a method in which a molten glass is caused to overflow from both sides of a wedge-shaped refractory, and the overflowing molten glasses are subjected to down-draw downward at the lower end of the wedge-shaped refractory while being joined, to thereby form a glass sheet. When a glass sheet is produced by the overflow down-draw method, surfaces that are to serve as the surfaces of the glass sheet are formed in a state of free surfaces without being brought into contact with the refractory. As a result, a glass sheet having good surface quality can be produced without polishing at low cost and an increase in area and a reduction in thickness are easily achieved as well. It should be noted that a material for the refractory to be used in the overflow down-draw method is not particularly limited as long as desired dimensions and surface accuracy can be realized. In addition, a method of applying a force to glass at the time of performing down-draw downward is also not particularly limited. For example, there may be adopted a method involving rotating a heat-resistant roll having a sufficiently large width in a state of being in contact with glass, to thereby draw the glass, or a method involving allowing a plurality of pairs of heat-resistant rolls to come into contact with only the vicinities of end surfaces of glass, to thereby draw the glass.

The glass sheet may also be formed by, for example, a down-draw method (such as a slot down method or a redraw method), a float method, or the like, besides the overflow down-draw method.

The thickness (sheet thickness) of the glass of the present invention is not particularly limited, but is preferably 0.5 mm or less, 0.4 mm or less, or 0.35 mm or less, particularly preferably 0.3 mm or less. As the thickness becomes smaller, the weight of a device can be reduced more easily. In contrast, as the thickness becomes smaller, the glass sheet is more liable to be deflected. However, because the glass of the present invention has a high Young's modulus and a high specific Young's modulus, failures attributed to deflection do not easily occur. It should be noted that the thickness can be adjusted by controlling, for example, the flow rate and the sheet-drawing speed at the time of glass production.

When the β-oil value of the glass of the present invention is reduced, the strain point can be increased. The β-OH value is preferably 0.5/mm or less, 0.45/mm or less, or 0.4/mm or less, particularly preferably 0.35/mm or less. When the β-OH value is too large, the strain point is liable to lower. It should be noted that, when the β-OH value is too small, the meltability is liable to lower. Thus, the β-OH value is preferably 0.01/mm or more, particularly preferably 0.05/mm or more.

The following methods are given as methods of reducing the β-OH value. (1) Materials having a low water content are selected, (2) components (such as Cl and $SO_3$) for reducing the β-OH value in glass are added, (3) the water content in the atmosphere in a furnace is reduced, (4) $N_2$ bubbling is carried out in molten glass, (5) a small melting furnace is adopted, (6) the flow rate of molten glass is increased, and (7) an electric melting method is adopted.

Herein, the "β-OH value" refers to a value obtained by measuring the transmittance of glass with an FT-IR and calculating by using the following equation.

β-OH value=$(1/X)\log(T_1/T_2)$

X: Glass thickness (mm)

$T_1$: Transmittance (%) at a reference wavelength of 3,846 $cm^{-1}$ $T_2$: Minimum transmittance (%) at a wavelength around a hydroxyl group absorption wavelength of 3,600 $cm^{-1}$ The glass of the present invention is preferably used for a substrate of an OLED display. Although the OLED display is now generally commercially available, cost reduction thereof through mass production is strongly desired. The glass of the present invention is excellent in productivity and can be easily increased in area or reduced in thickness, and hence can meet such demands properly.

Example 1

The present invention is hereinafter described in detail by way of Examples. However, Examples below are merely examples, and the present invention is by no means limited thereto.

Examples of the present invention (Sample Nos. 1 to 30) are shown in Tables 1 to 3.

TABLE 1

| | | No. 1 | No. 2 | No. 3 | No. 4 | No. 5 | No. 6 | No. 7 | No. 3 | No. 9 | No. 10 |
|---|---|---|---|---|---|---|---|---|---|---|---|
| Glass composition (wt %) | $SiO_2$ | 61.7 | 61.7 | 61.6 | 61.6 | 61.7 | 62.7 | 62.7 | 62.7 | 63.6 | 63.6 |
| | $Al_2O_3$ | 20 | 20 | 20 | 20 | 20 | 19 | 19 | 19 | 18 | 18 |
| | $B_2O_3$ | 6 | 6 | 6 | 6 | 6 | 6 | 6 | 6 | 6 | 6 |
| | MgO | 2 | 2 | 0.1 | 0.1 | 4 | 2 | 2 | 4 | 0.1 | 0.1 |
| | CaO | 8 | 8 | 8 | 8 | 6 | 1 | 6 | 4 | 8 | 6 |
| | SrO | — | 2 | 4 | 2 | — | 8 | 2 | 2 | 2 | 6 |
| | BaO | 2 | — | — | 2 | 2 | 1 | 2 | 2 | 2 | 4 |
| | $SnO_2$ | 0.3 | 0.3 | 0.3 | 0.3 | 0.3 | 0.3 | 0.3 | 0.3 | 0.3 | 0.3 |
| | $ZrO_2$ | 0.015 | 0.020 | 0.025 | 0.030 | 0.010 | 0.010 | 0.010 | 0.010 | 0.010 | 0.010 |
| | $TiO_2$ | 0.010 | 0.010 | 0.010 | 0.005 | 0.005 | 0.010 | 0.005 | 0.005 | 0.010 | 0.020 |
| | $Fe_2O_3$ | 0.012 | 0.015 | 0.010 | 0.005 | 0.007 | 0.005 | 0.006 | 0.007 | 0.009 | 0.010 |
| | $Cr_2O_3$ | 0.0001 | 0.0002 | 0.0002 | 0.0001 | 0.0001 | 0.0001 | 0.0001 | 0.0001 | 0.0002 | 0.0001 |
| | $Rh_2O_3$ | 0.00005 | 0.00005 | 0.00003 | 0.00005 | 0.00005 | 0.00005 | 0.00006 | 0.00005 | 0.00010 | 0.00005 |
| | $SO_3$ | 0.0002 | 0.0001 | 0.0001 | 0.0002 | 0.0002 | 0.0001 | 0.0001 | 0.0003 | 0.0003 | 0.0002 |
| Molar ratio | $RO/Al_2O_3$ | 1.05 | 1.08 | 0.94 | 0.90 | 1.12 | 1.02 | 1.01 | 1.09 | 1.02 | 0.93 |
| | $CaO/Al_2O_3$ | 0.73 | 0.73 | 0.73 | 0.73 | 0.55 | 0.77 | 0.57 | 0.38 | 0.81 | 0.61 |
| | CaO/MgO | 2.88 | 2.88 | 57.5 | 57.5 | 1.08 | 5.75 | 2.16 | 0.76 | 28.8 | 21.6 |
| Density (g/cm³) | | 2.47 | 2.47 | 2.47 | 2.47 | 2.47 | 2.46 | 2.47 | 2.47 | 2.46 | 2.47 |
| Thermal expansion coefficient [30° C. to 380° C.] (×10⁻⁷/° C.) | | 35 | 36 | 35 | 36 | 34 | 35 | 34 | 33 | 36 | 34 |
| Young's modulus (GPa) | | 79 | 80 | 77 | 77 | 81 | 78 | 78 | 80 | 76 | 75 |
| Specific Young's modulus (GPa/g·cm⁻³) | | 32.0 | 32.4 | 31.1 | 31.0 | 32.8 | 31.5 | 31.7 | 32.4 | 30.7 | 30.3 |
| Strain point (° C.) | | 709 | 708 | 721 | 720 | 707 | 709 | 708 | 705 | 715 | 716 |
| Softening point (° C.) | | 998 | 993 | 1,021 | 1,019 | 988 | 1,007 | 1,006 | 997 | 1,091 | 1,030 |
| Viscosity at high temperature (° C.) | $10^{2.5}$ dPa·s | 1,563 | 1,558 | 1,564 | 1,626 | 1,539 | 1,592 | 1,595 | 1,576 | 1,678 | 1,670 |
| | $10^{5.0}$ dPa·s | 1,194 | 1,189 | 1,203 | 1,223 | 1,178 | 1,209 | 1,210 | 1,199 | 1,235 | 1,250 |
| Liquidus line temperature (° C.) | | 1,199 | 1,195 | 1,212 | 1,223 | 1,207 | 1,187 | 1,198 | 1,224 | 1,191 | 1,192 |
| Initial phase | | Ano Cri Mul | Ano Cri | Cri Mul | Ano Mul | Cri Mul | Ano Cri | Cri Mul | Cri Mul | Ano Cri | Cri Mul |
| Liquidus line viscosity logη (dPa·s) | | 5.0 | 4.9 | 4.9 | 5.0 | 4.7 | 5.2 | 5.1 | 4.8 | 5.4 | 5.6 |
| Chemical resistance | HCl | ○ | ○ | ○ | ○ | ○ | ○ | ○ | ○ | ○ | ○ |
| | BHF | ○ | ○ | ○ | ○ | ○ | ○ | ○ | ○ | ○ | ○ |

TABLE 2

| | | No. 11 | No. 12 | No. 13 | No. 14 | No. 15 | No. 16 | No. 17 | No. 18 | No. 19 | No. 20 |
|---|---|---|---|---|---|---|---|---|---|---|---|
| Glass composition (wt %) | SiO$_2$ | 63.7 | 62.7 | 62.7 | 63.2 | 62.7 | 62.7 | 62.4 | 63.2 | 62.7 | 62.7 |
| | Al$_2$O$_3$ | 18 | 20 | 19 | 19 | 19 | 19 | 19 | 18 | 19 | 18.5 |
| | B$_2$O$_3$ | 6 | 6 | 6 | 5.5 | 6 | 6 | 6 | 6 | 6 | 6.5 |
| | MgO | 9 | 2 | 1 | 1 | 1 | 1 | 0.3 | 1 | 1 | 1 |
| | CaO | 4 | 8 | 8 | 8 | 6 | 7 | 7 | 8 | 7.5 | 7 |
| | SrO | 4 | — | 2 | 2 | 3 | 2 | 3 | 1 | 2 | 2 |
| | BaO | 2 | 1 | 1 | 1 | 2 | 2 | 2 | 2.5 | 1.5 | 2 |
| | SnO$_2$ | 0.3 | 0.3 | 0.3 | 0.3 | 0.3 | 0.3 | 0.3 | 0.3 | 0.3 | 0.3 |
| | ZrO$_2$ | 0.015 | 0.020 | 0.025 | 0.030 | 0.010 | 0.010 | 0.010 | 0.010 | 0.010 | 0.010 |
| | TiO$_2$ | 0.010 | 0.010 | 0.010 | 0.005 | 0.005 | 0.010 | 0.005 | 0.005 | 0.010 | 0.020 |
| | Fe$_2$O$_3$ | 0.012 | 0.015 | 0.010 | 0.005 | 0.007 | 0.005 | 0.006 | 0.007 | 0.009 | 0.010 |
| | Cr$_2$O$_3$ | 0.0001 | 0.0002 | 0.0002 | 0.0001 | 0.0001 | 0.0001 | 0.0001 | 0.0001 | 0.0002 | 0.0001 |
| | Rh$_2$O$_3$ | 0.00005 | 0.00005 | 0.00003 | 0.00005 | 0.00005 | 0.00005 | 0.00006 | 0.00005 | 0.00010 | 0.00005 |
| | SO$_3$ | 0.0002 | 0.0001 | 0.0001 | 0.0002 | 0.0002 | 0.0001 | 0.0001 | 0.0003 | 0.0003 | 0.0002 |
| Molar ratio | RO/Al$_2$O$_3$ | 0.98 | 1.01 | 1.04 | 1.04 | 0.93 | 0.98 | 0.98 | 1.10 | 1.01 | 1.00 |
| | CaO/Al$_2$O$_3$ | 0.40 | 0.73 | 0.77 | 0.77 | 0.57 | 0.67 | 0.67 | 0.81 | 0.72 | 0.69 |
| | CaO/MgO | 1.44 | 2.88 | 5.75 | 5.75 | 4.31 | 5.03 | 16.77 | 5.75 | 5.39 | 5.03 |
| Density (g/cm$^3$) | | 2.47 | 2.45 | 2.46 | 2.47 | 2.47 | 2.47 | 2.47 | 2.47 | 2.47 | 2.46 |
| Thermal expansion coefficient [30° C. to 380° C.] (×10$^{-7}$/° C.) | | 33 | 34 | 36 | 36 | 34 | 35 | 35 | 36 | 35 | 35 |
| Young's modulus (GPa) | | 77 | 79 | 78 | 78 | 77 | 77 | 76 | 77 | 78 | 76 |
| Specific Young's modulus (GPa/g · cm$^{-3}$) | | 31.1 | 32.4 | 31.5 | 31.6 | 31.2 | 31.2 | 30.6 | 31.1 | 31.5 | 31.0 |
| Strain point (° C.) | | 707 | 711 | 710 | 714 | 711 | 710 | 719 | 705 | 714 | 706 |
| Softening point (° C.) | | 1,018 | 1,001 | 1,005 | 1,012 | 1,017 | 1,011 | 1,025 | 1,005 | 1,012 | 1,008 |
| Viscosity at 10$^{2.5}$ dPa · s high temperature (° C.) | | 1,629 | 1,565 | 1,613 | 1,623 | 1,620 | 1,602 | 1,662 | 1,597 | 1,603 | 1,652 |
| Viscosity at 10$^{5.0}$ dPa · s high temperature (° C.) | | 1,232 | 1,197 | 1,209 | 1,216 | 1,226 | 1,217 | 1,241 | 1,212 | 1,214 | 1,218 |
| Liquidus line temperature (° C.) | | 1,212 | 1,214 | 1,183 | 1,193 | 1,230 | 1,179 | 1,210 | 1,179 | 1,178 | 1,165 |
| Initial phase | | Cri Mul | Cri Mul | Ano Cri | Ano Cri | Cri Mul | Ano Cri Mul | Ano Mul | Ano Cri | Ano Cri | Ano Cri |
| Liquidus line viscosity log η (dPa · s) | | 5.2 | 4.8 | 5.3 | 5.2 | 5.0 | 5.4 | 5.3 | 5.3 | 5.4 | 5.5 |
| Chemical resistance | HCl | ○ | ○ | ○ | ○ | ○ | ○ | ○ | ○ | ○ | ○ |
| | BHF | ○ | ○ | ○ | ○ | ○ | ○ | ○ | ○ | ○ | ○ |

TABLE 3

| | | No. 21 | No. 22 | No. 23 | No. 24 | No. 25 | No. 26 | No. 27 | No. 28 | No. 29 | No. 30 |
|---|---|---|---|---|---|---|---|---|---|---|---|
| Glass composition (wt %) | SiO$_2$ | 62.05 | 62.2 | 62.7 | 62.2 | 62.7 | 63.2 | 63.7 | 63.2 | 62.7 | 62.7 |
| | Al$_2$O$_3$ | 19.5 | 19 | 19 | 19 | 19 | 19 | 19 | 18 | 18.5 | 18 |
| | B$_2$O$_3$ | 5.95 | 6 | 6 | 6.5 | 6 | 5.5 | 5 | 6 | 6 | 6 |
| | MgO | 1.5 | 1.5 | 1 | 1 | 1 | 1 | 1 | 0.5 | 0.5 | 1 |
| | CaO | 6.9 | 7 | 7 | 7 | 7 | 7 | 7 | 8 | 8 | 8 |
| | SrO | 1.9 | 2 | 2 | 2 | 3 | 2 | 2 | 3 | 3 | 3 |
| | BaO | 1.9 | 2 | 2 | 2 | 1 | 2 | 2 | 1 | 1 | 1 |
| | SnO$_2$ | 0.3 | 0.3 | 0.3 | 0.3 | 0.3 | 0.3 | 0.3 | 0.3 | 0.3 | 0.3 |
| | ZrO$_2$ | 0.015 | 0.020 | 0.025 | 0.030 | 0.010 | 0.010 | 0.010 | 0.010 | 0.010 | 0.010 |
| | TiO$_2$ | 0.010 | 0.010 | 0.010 | 0.005 | 0.005 | 0.010 | 0.005 | 0.005 | 0.010 | 0.020 |
| | Fe$_2$O$_3$ | 0.012 | 0.015 | 0.010 | 0.005 | 0.007 | 0.005 | 0.006 | 0.007 | 0.009 | 0.010 |
| | Cr$_2$O$_3$ | 0.0001 | 0.0002 | 0.0002 | 0.0001 | 0.0001 | 0.0001 | 0.0001 | 0.0001 | 0.0002 | 0.0001 |
| | Rh$_2$O$_3$ | 0.00005 | 0.00005 | 0.00003 | 0.00005 | 0.00005 | 0.00005 | 0.00006 | 0.00003 | 0.00010 | 0.00005 |
| | SO$_3$ | 0.0002 | 0.0001 | 0.0001 | 0.0002 | 0.0002 | 0.0001 | 0.0001 | 0.0003 | 0.0003 | 0.0002 |
| Molar ratio | RO/Al$_2$O$_3$ | 1.00 | 1.04 | 0.98 | 0.98 | 0.98 | 0.98 | 0.98 | 1.08 | 1.05 | 1.15 |
| | CaO/Al$_2$O$_3$ | 0.64 | 0.67 | 0.67 | 0.67 | 0.67 | 0.67 | 0.67 | 0.81 | 0.79 | 0.81 |
| | CaO/MgO | 3.31 | 3.35 | 5.03 | 5.03 | 5.03 | 5.03 | 5.03 | 11.50 | 11.50 | 5.75 |
| Density (g/cm$^3$) | | 2.47 | 2.48 | 2.47 | 2.46 | 2.47 | 2.47 | 2.48 | 2.47 | 2.47 | 2.48 |
| Thermal expansion coefficient [30° C. to 380° C.] (×10$^{-7}$/° C.) | | 35 | 36 | 35 | 35 | 35 | 35 | 35 | 36 | 37 | 37 |
| Young's modulus (GPa) | | 78 | 78 | 77 | 76 | 76 | 77 | 78 | 76 | 77 | 77 |
| Specific Young's modulus | | 31.6 | 31.4 | 31.2 | 31.0 | 30.9 | 31.3 | 31.4 | 31.0 | 31.1 | 31.2 |
| Strain point (° C.) | | 709 | 706 | 712 | 703 | 707 | 716 | 719 | 707 | 708 | 702 |
| Softening point (° C.) | | 1,004 | 1,002 | 1,013 | 1,007 | 1,008 | 1,017 | 1,020 | 1,008 | 1,007 | 998 |
| Viscosity at 10$^{2.5}$ dPa·s high temperature | | 1,585 | 1,590 | 1,605 | 1,601 | 1,596 | 1,627 | 1,619 | 1,602 | 1,594 | 1,588 |
| 10$^{5.0}$ dPa·s (° C.) | | 1,204 | 1,205 | 1,219 | 1,213 | 1,211 | 1,224 | 1,230 | 1,216 | 1,210 | 1,203 |
| Liquidus line temperature (° C.) | | 1,187 | 1,178 | 1,165 | 1,163 | 1,172 | 1,191 | 1,204 | 1,195 | 1,190 | 1,168 |
| Initial phase | | Cri Mul | Ano Cri | Ano Cri Mul | Ano Cri Mul | Ano Cri Mul | Ano Cri Mul | Ano Cri Mul | Ano Cri | Ano Cri | Ano Cri |
| Liquidus line viscosity log η (dPa·s) | | 5.2 | 5.3 | 5.6 | 5.5 | 5.4 | 5.3 | 5.3 | 5.9 | 5.2 | 5.4 |
| Chemical resistance | HCl | ○ | ○ | ○ | ○ | ○ | ○ | ○ | ○ | ○ | ○ |
| | BHF | ○ | ○ | ○ | ○ | ○ | ○ | ○ | ○ | ○ | ○ |

Each sample was produced in the following manner. First, a glass batch prepared by blending glass raw materials so that each glass composition listed in the tables was attained was placed in a platinum crucible, and then melted at 1,600° C. for 24 hours. When the glass batch was dissolved, molten glass was stirred by using a platinum stirrer to homogenize it. Next, the molten glass was poured on a carbon sheet and formed into a glass sheet. Each of the resultant samples was evaluated for its density, thermal expansion coefficient, Young's modulus, specific Young's modulus, strain point, softening point, temperature at a viscosity at high temperature of $10^{2.5}$ dPa·s, temperature at a viscosity at high temperature of $10^{5.0}$ dPa·s, liquidus line temperature, initial phase, liquidus line viscosity log ηTL, and chemical resistance.

The density is a value obtained by measurement by a well-known Archimedes method.

The thermal expansion coefficient is an average thermal expansion coefficient measured in the temperature range of from 30° C. to 380° C. with a dilatometer.

The Young's modulus refers to a value measured by a dynamic elastic modulus measurement method (resonance method) in accordance with JIS R1602, and the specific Young's modulus is a value obtained by dividing the Young's modulus by the density.

The strain point and the softening temperature are values measured by a fiber elongation method based on the method of ASTM C336.

The temperatures at viscosities at high temperature of $10^{2.5}$ dPa·s and $10^{5.0}$ dPa·s are values obtained by measurement by a platinum sphere pull up method.

Next, each of the samples was pulverized, and glass powder that passed through a standard 30-mesh sieve (500 µm) and remained on a 50-mesh sieve (300 µm) was placed in a platinum boat and kept for 24 hours in a gradient heating furnace, followed by taking the platinum boat out of the gradient heating furnace. The highest temperature at which devitrification (crystalline foreign matter) was observed in the glass by microscopy was defined as the liquidus line temperature. In addition, a crystal which precipitated in a temperature range of from the liquidus line temperature to (the liquidus line temperature—50° C.) was evaluated as an initial phase. In Tables 1 to 3, the "Ano" represents anorthite, the "Cri" represents cristobalite, and the "Mul" represents mullite. Further, the viscosity of the glass at the liquidus line temperature was measured by a platinum sphere pull up method and was defined as the liquidus line viscosity.

In addition, each of the samples was optically polished on both surfaces, and then immersed in a chemical solution having a predetermined concentration at a predetermined temperature for a predetermined time period. The chemical resistance was evaluated by observing the surface of the obtained sample. Specifically, after the treatment using the chemical solution, the case where the glass surface had strong white turbidity or cracks was represented by Symbol "×", the case where the glass surface had slight white turbidity or appeared to be rough was represented by Symbol "Δ", and the case where the glass surface had no change was represented by Symbol "○". The conditions of the treatment using the chemical solution areas follows: the acid resistance was evaluated by treatment using 10 mass % hydrochloric acid at 80° C. for 3 hours; and the BHF resistance was evaluated by treatment using a well-known 130 BHF solution at 20° C. for 30 minutes.

The samples Nos. 1 to 30 each have a density of from 2.45 g/cm³ to 2.48 g/cm³, and can achieve a reduction in weight of a glass sheet. In addition, the thermal expansion coefficient is from $33 \times 10^{-7}$/° C. to $37 \times 10^{-7}$/° C., the strain point is 702° C. or more, and the thermal shrinkage value can be reduced. In addition, the Young's modulus is 75 GPa or more, the specific Young's modulus is 30.3 GPa/(g/cm³) or more, and deflection and deformation hardly occur. In addition, the temperature at a viscosity at high temperature of $10^{2.5}$ dPa·s is 1,678° C. or less, and the temperature at a viscosity at high temperature of $10^{5.0}$ dPa·s is 1,250° C. or less. Further, the liquidus line temperature is 1,230° C. or less, and the liquidus line viscosity is $10^{4.8}$ dPa·s or more. Therefore, the meltability and the formability are excellent, and mass-production can be applied. Further, the chemical resistance is excellent.

Example 2

With regard to the materials of Sample Nos. 12, 20, 23, and 24 in Tables, a glass sheet having a thickness of 0.5 mm was formed by an overflow down-draw method, and the glass sheet was cut into dimensions of 30 mm×160 mm. It should be noted that, when the annealing point of the glass was defined as Ta (° C.), and an average cooling temperature during the forming in a temperature range of from a temperature 100° C. higher than Ta to a temperature 100° C. lower than Ta was defined as R (° C./min), the cooling conditions during the forming were adjusted so that the relationship log R≤0.00011821Ta²−0.14847Ta+47.03 was satisfied. Next, the obtained glass sheet was measured for the thermal shrinkage value after the temperature is increased from room temperature (25° C.) to 500° C. at a rate of 5° C./min, retained at 500° C. for 1 hour, and then decreased therefrom to room temperature at a rate of 5° C./min. As a result, the thermal shrinkage value was found to be from 15 ppm to 20 ppm.

INDUSTRIAL APPLICABILITY

The glass of the present invention can be remarkably increased in devitrification resistance even when having a high strain point and a high Young's modulus. Accordingly, the glass of the present invention is suitable for a substrate of a display, such as an OLED display or a liquid crystal display, and particularly suitable for a substrate of a display driven by a LIPS or an oxide TFT.

The invention claimed is:

1. A glass, comprising as a glass composition SiO₂, 18% to 25% by mass of Al₂O₃, 3% to 8% by mass of B₂O₃, 0% to 5% by mass of BaO, 2% to 13% by mass of CaO, 0.001% to 0.05% by mass of Fe₂O₃, 0.01% to 0.5% by mass of SnO₂, 0% to 4.5% by mass of SrO, and 0% to 1.5% by mass of MgO and having a molar ratio CaO/Al₂O₃ of 0.3 to 0.9, and allowing two or more crystals selected from the group consisting of a SiO₂—Al₂O₃—RO-based crystal, a SiO₂-based crystal, and a SiO₂—Al₂O₃-based crystal to precipitate in a temperature range of from a liquidus line temperature to (the liquidus line temperature −50° C.).

2. The glass according to claim 1, wherein the SiO₂—Al₂O₃—RO-based crystal comprises anorthite, the SiO₂-based crystal comprises cristobalite, and the SiO₂—Al₂O₃-based crystal comprises mullite.

3. The glass according to claim 1, wherein the liquidus line temperature is lower than 1,250° C.

4. The glass according to claim 1, wherein a content of Li₂O+Na₂O+K₂O in the glass composition is 0.5 mass % or less.

5. The glass according to claim 1, wherein the glass comprises as a glass composition, in terms of mass %, 57% to 70% of $SiO_2$, 18% to 25% of $Al_2O_3$, 3% to 8% of $B_2O_3$, 0% to 1.5% of MgO, 2% to 13% of CaO, 0% to 4.5% of SrO, 0% to 5% of BaO, 0% to 5% of ZnO, 0% to 5% of $ZrO_2$, 0% to 5% of $TiO_2$, 0.001% to 0.05% of $Fe_2O_3$, 0.01% to 0.5% of $SnO_2$, and 0% to 5% of $P_2O_5$, and has a molar ratio $(MgO+CaO+SrO+BaO)/Al_2O_3$ of from 0.8 to 1.3 and a molar ratio $CaO/Al_2O_3$ of from 0.3 to 0.9.

6. The glass according to claim 1, wherein the glass comprises as a glass composition, in terms of mass %, 58% to 70% of $SiO_2$, 18% to 25% of $Al_2O_3$, 3% to 7% of $B_2O_3$, 0% to 1.5% of MgO, 3% to 13% of CaO, 0% to 4.5% of SrO, 0% to 5% of BaO, 0% to 5% of ZnO, 0% to 5% of $ZrO_2$, 0% to 5% of $TiO_2$, 0% to 5% of $P_2O_5$, 0.001% to 0.05% of $Fe_2O_3$, and 0.01% to 0.5% of $SnO_2$, has a molar ratio $(MgO+CaO+SrO+BaO)/Al_2O_3$ of from 0.8 to 1.3 and a molar ratio $CaO/Al_2O_3$ of from 0.3 to 0.9, and is substantially free of $Li_2O$ and $Na_2O$.

7. The glass according to claim 1, wherein the glass has a molar ratio CaO/MgO of from 2 to 20.

8. The glass according to claim 1, wherein the glass has a strain point of 700° C. or more.

9. The glass according to claim 1, wherein the glass has a Young's modulus of 75 GPa or more.

10. The glass according to claim 1, wherein the glass has a specific Young's modulus of 30 $GPa/(g/cm^3)$ or more.

11. The glass according to claim 1, wherein the glass has a flat sheet shape and is used for a liquid crystal display.

12. The glass according to claim 1, wherein the glass has a flat sheet shape and is used for an OLED display.

13. The glass according to claim 1, wherein the glass has a flat sheet shape and is used for a display driven by an oxide TFT.

* * * * *